(12) United States Patent
Namazi et al.

(10) Patent No.: US 12,001,058 B2
(45) Date of Patent: Jun. 4, 2024

(54) HIGH FIDELITY STORAGE AND RETRIEVAL OF QUANTUM INFORMATION IN A WARM ATOMIC VAPOR CELL DEVICE

(71) Applicant: Qunnect, Inc., Brooklyn, NY (US)

(72) Inventors: Mehdi Namazi, Brooklyn, NY (US);
Mael Flament, Brooklyn, NY (US);
Yang Wang, New York, NY (US);
Alexander Craddock, Brooklyn, NY (US)

(73) Assignee: Qunnect, Inc., Brooklyn, NY (US)

( * ) Notice: Subject to any disclaimer, the term of this patent is extended or adjusted under 35 U.S.C. 154(b) by 0 days.

(21) Appl. No.: 18/275,567

(22) PCT Filed: Feb. 4, 2022

(86) PCT No.: PCT/US2022/015299
§ 371 (c)(1),
(2) Date: Aug. 2, 2023

(87) PCT Pub. No.: WO2022/170086
PCT Pub. Date: Aug. 11, 2022

(65) Prior Publication Data
US 2024/0045144 A1    Feb. 8, 2024

Related U.S. Application Data

(60) Provisional application No. 63/245,763, filed on Sep. 17, 2021, provisional application No. 63/146,201, filed on Feb. 5, 2021.

(51) Int. Cl.
*G02B 27/28* (2006.01)
*B82Y 10/00* (2011.01)
*G02B 6/293* (2006.01)

(52) U.S. Cl.
CPC ....... *G02B 6/29358* (2013.01); *G02B 6/2931* (2013.01); *G02B 27/283* (2013.01); *G02B 27/286* (2013.01)

(58) Field of Classification Search
CPC .............. G02B 6/29358; G02B 6/2931; G02B 27/283; G02B 27/286
(Continued)

(56) References Cited

U.S. PATENT DOCUMENTS

2013/0308956 A1    11/2013    Meyers et al.
2021/0028865 A1     1/2021    Figueroa et al.

FOREIGN PATENT DOCUMENTS

CN        111147243 A      5/2020
KR    10-2022-0040053 A    3/2022

OTHER PUBLICATIONS

International Search Report and Written Opinion dated Jun. 6, 2022, in connection with International Application No. PCT/US22/15299.
(Continued)

*Primary Examiner* — Joseph P Martinez
*Assistant Examiner* — Grant A Gagnon
(74) *Attorney, Agent, or Firm* — Wolf, Greenfield & Sacks, P.C.

(57) ABSTRACT

A quantum memory device and methods for storage and retrieval of a qubit from the quantum memory device are described. The quantum memory device includes a first optical component to convert an input qubit encoded in an arbitrary polarization state of a photon into a spatial qubit propagating in a pair of parallel optical rails, an atomic vapor memory to store the spatial qubit in an atomic vapor, and a second optical component to combine the spatial qubit, when retrieved from the atomic vapor memory, into an output qubit encoded in an arbitrary polarization state of a photon.

20 Claims, 10 Drawing Sheets

(58) Field of Classification Search
USPC .......................................................... 359/485
See application file for complete search history.

(56) References Cited

OTHER PUBLICATIONS

Gao et al., Experimental Realization of a Controlled-NOT Gate with Four-Photon Six-Qubit Cluster States. Physical Review Letters. The Physical Society. Jan. 15, 2010;104(2):020501-1-020501-4.

HIGH FIDELITY STORAGE AND RETRIEVAL OF QUANTUM INFORMATION IN A WARM ATOMIC VAPOR CELL DEVICE

CROSS REFERENCE TO RELATED APPLICATIONS

This application is a national stage filing under 35 U.S.C. § 371 of International Patent Application Serial No. PCT/US2022/015299, filed Feb. 4, 2022, titled "HIGH FIDELITY STORAGE AND RETRIEVAL OF QUANTUM INFORMATION IN A WARM ATOMIC VAPOR CELL DEVICE", which claims the benefit under 35 U.S.C. § 119(e) to U.S. Provisional Application No. 63/146,201, filed Feb. 5, 2021, titled "HIGH FIDELITY STORAGE AND RETRIEVAL OF QUANTUM INFORMATION IN A WARM ATOMIC VAPOR CELL DEVICE," and U.S. Provisional Application No. 63/245,763, filed Sep. 17, 2021, titled "HIGH FIDELITY STORAGE AND RETRIEVAL OF QUANTUM INFORMATION IN A WARM ATOMIC VAPOR CELL DEVICE," each of which are incorporated herein by reference in their entirety.

FEDERALLY SPONSORED RESEARCH

This invention was made with government support under DE-SC0019702 awarded by the United States Department of Energy. The government has certain rights in the invention.

BACKGROUND

Quantum networks facilitate the transmission of information in the form of quantum bits ("qubits") between physically separated quantum processors or other quantum devices (e.g., quantum sensors). Quantum networks may be used to enable optical quantum communication over distances and can be implemented over standard telecommunication optical fibers through the transmission of single photons onto which information is encoded (e.g., in polarization). To enable the reliable transmission of quantum information over any distances, additional components may be needed.

SUMMARY

The following is a non-limiting summary of some embodiments of the present application. Some aspects of the present application are directed to a quantum memory device. The quantum memory device comprises: a first optical component configured to convert an input qubit encoded in an arbitrary polarization state of a photon into a spatial qubit propagating in a pair of parallel optical rails; an atomic vapor memory coupled to an output of the first optical component and configured to store the spatial qubit in an atomic vapor; and a second optical component coupled to an output of the atomic vapor memory, the second optical component configured to convert the spatial qubit, when retrieved from the atomic vapor memory, into an output qubit, the output qubit encoded in the arbitrary polarization state of a photon.

In some embodiments, the first optical component and/or the second optical component are a Sagnac-like device that comprises: a polarization beam splitter (PBS); a first variable angle mirror optically coupled to a first output of the PBS; and a second variable angle mirror optically coupled to a second output of the PBS. In some embodiments, the first variable angle mirror is disposed at a first angle relative to the polarization beam splitter, and the second variable angle mirror is disposed at a second angle relative to the polarization beam splitter, wherein the second angle is different than the first angle. In some embodiments, changing the first and/or second angle causes a change in a separation between optical rails of the pair of parallel optical rails.

In some embodiments, the quantum memory device further comprises a Bragg grating filter optically coupled to an input of the first optical component.

In some embodiments, the quantum memory device further comprises a pair of flat etalon cavities optically coupled to an output of the second optical component. In some embodiments, the flat etalon cavities of the pair of flat etalon cavities are arranged with their incident faces at a small off-parallel angle. In some embodiments, the quantum memory device further comprises at least three mirrors configured to cause the output qubit to pass through the pair of flat etalon cavities at least twice.

In some embodiments, the quantum memory device further comprises a pair of curved etalon cavities optically coupled to an output of the second optical component.

Some aspects of the present application are directed to a method of storing and retrieving a qubit. The method comprises: receiving a qubit encoded in an arbitrary polarization state of a photon; converting, using a first optical component comprising a Sagnac-like configuration of optical elements, the qubit into a spatial qubit propagating in a pair of parallel optical rails; storing the spatial qubit in an atomic vapor memory; retrieving and outputting the spatial qubit from the atomic vapor memory; reconverting, using a second optical component comprising a Sagnac-like configuration of optical elements, the spatial qubit into the qubit encoded in the arbitrary polarization state; and outputting the qubit.

In some embodiments, converting the qubit into a spatial qubit comprises: receiving the qubit at a polarization beam splitter (PBS); converting the qubit into the spatial qubit using the PBS; directing the spatial qubit back through the PBS using a first variable angle mirror and a second variable angle mirror; and outputting, from the PBS, the spatial qubit to a pair of parallel optical rails.

In some embodiments, the first variable angle mirror is disposed at a first angle relative to the PBS, the second variable angle mirror is disposed at a second angle relative to the PBS, and the method further comprises changing a spacing between rails of the pair of parallel optical rails by changing the first and/or the second angle.

In some embodiments, the method further comprises changing a coherence time for storage of the qubit by: increasing the spacing between rails of the pair of parallel optical rails; and increasing a diameter of each rail of the pair of parallel optical rails incident to the atomic vapor memory.

In some embodiments, the method further comprises combining a pair of control field beams with respective rails of the pair of optical rails prior to storing the spatial qubit in the atomic vapor memory.

In some embodiments, the method further comprises filtering an input control field beam using a Bragg grating filter.

In some embodiments, the method further comprises, after outputting the qubit: passing the qubit in a first instance and in a first direction through two flat etalons, the two flat etalons being arranged with their incident faces at a small off-parallel angle; and passing the qubit in a second instance and in the first direction through the two flat etalons. In some embodiments, passing the qubit in the second instance through the two flat etalons comprises using three or more mirrors to steer the qubit. In some embodiments, the qubit, in the first instance, passes through the two flat etalons at a first location to one side of a central axis of the two flat etalons; and the qubit, in the second instance, passes through the two flat etalons at a second location to another side of the central axis. In some embodiments, passing the qubit through the two flat etalons in the first and second instances achieves an extinction ratio of greater than or equal to 100 dB and less than or equal to 150 dB.

In some embodiments, the method further comprises, after outputting the qubit: passing the qubit in a first direction through two curved etalons, the two curved etalons being arranged with their incident faces at a small off-parallel angle.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
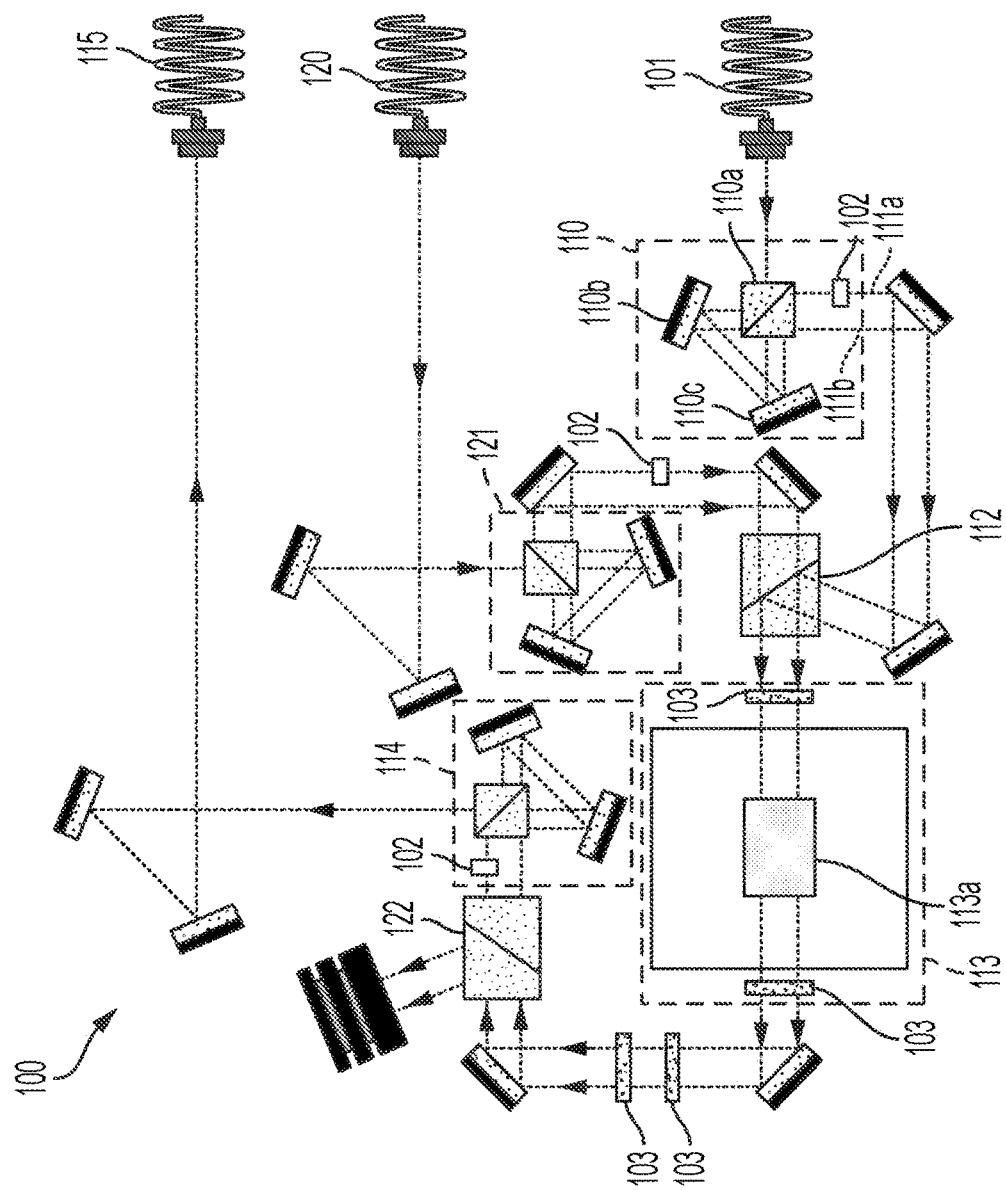
FIG. 1 shows a schematic diagram of a device 100 configured to store and retrieve qubits using a light-matter interface, in accordance with some embodiments of the technology described herein.

Room temperature quantum memories are used in quantum network architectures, allowing for the temporary storage and synchronization of photonic qubits across the network. To perform such functions, the quantum memory receives and coherently stores any random input qubit without damaging the information encoded on the qubits. The inventors have recognized and appreciated that qubits having an arbitrary polarization may be stored by separating the vertical and/or horizontal polarization components of the qubits into independent optical beams ("rails"). The separated vertical and horizontal components may then be recombined into a single optical beam after retrieval from storage.

Accordingly, a dual rail quantum memory system is described herein. The dual rail quantum memory uses optical elements arranged in a Sagnac-like configuration with mismatched mirror angles to separate, and after retrieval, combine the vertical and horizontal polarization components of the qubits. In a traditional Sagnac configuration, identical overlapping optical paths are provided for an optical beam that has been split into two. The inventors have recognized and appreciated that these two beams may be separated, rather than overlapped, by a distance defined by the mirror angles in the Sagnac-like configuration. The beams may be separated by placing the mirrors of the Sagnac-like configuration at two slightly different angles (e.g., the angles may have a mismatch in range from 0° to 1°, 2°, 5°, and/or 10°). This arrangement allows for a tunable separation between the two optical beams. This tunability supports the use of different beam diameters, enabling, in turn, a tunable coherence time for the memory.

Accordingly, the inventors have developed a quantum memory device configured to store and retrieve qubits from an atomic vapor memory. The quantum memory device includes a first optical component (e.g., a Sagnac-like configuration) configured to convert an input qubit encoded in an arbitrary polarization state of a photon into a spatial qubit propagating in a pair of parallel optical rails. The quantum memory device includes an atomic vapor memory (e.g., including one or more atomic vapor cells) coupled to an output of the first optical component and configured to store the spatial qubit in an atomic vapor. Thereafter, the spatial qubit may be retrieved from the atomic vapor memory and output to a second optical component configured to convert the spatial qubit into an output qubit, the output qubit encoded in the arbitrary polarization state of a photon. The first optical component and/or the second optical components are Sagnac-like devices that include a polarization beam splitter (PBS) and two variable angle mirrors optically coupled to two outputs of the PBS.

The inventors have further developed an optical frequency filtering mechanism that achieves a high extinction (>120 dB) of the control field laser beam after retrieval of the qubits from the quantum memory. The optical filtering mechanism achieves this high extinction value by passing the light through low finesse flat etalons twice. Passing the light through the flat etalon cavities twice provides improved stability to thermal and mechanical alignment perturbations of the quantum memory.

Following below are more detailed descriptions of various concepts related to, and embodiments of, techniques for implementing dynamic polarization drift correction for quantum telecommunications systems. It should be appreciated that various aspects described herein may be implemented in any of numerous ways. Examples of specific implementations are provided herein for illustrative purposes only. In addition, the various aspects described in the embodiments below may be used alone or in any combinations and are not limited to the combinations explicitly described herein.

FIG. 1 shows a schematic diagram of optical device 100, in accordance with some embodiments of the technology described herein. The optical device 100 forms a quantum memory layer from which photons with qubits (e.g., of arbitrary polarization) can be stored and retrieved on demand. In FIG. 1, input 101 is an input port in which qubits (e.g., encoded in the polarization of a photon or photons) enter device 100. Device 100 includes a number of waveplates 102 and 103 configured to adjust the polarization of the qubits and/or the control field.

In some embodiments, the qubits travel from input 101 to module 110. Module 110 is a mixed-angle Sagnac interferometer that converts a received qubit encoded in the polarization state of a photon into a spatial qubit propagating along parallel optical rails 111a and 111b. Module 110 may encode the spatial qubit into the amplitude and the phase of the superposition of a single photon propagating along the parallel optical rails 111a and 111b. For example, if the received qubit were encoded in an arbitrary polarization state of $a|H\rangle + be^{i\theta}|V\rangle$, the spatial qubit output by the module 110 is encoded in the spatial state of $a|L\rangle + be^{i\theta}|R\rangle$, where $|L\rangle$ and $|R\rangle$ are the left and right rails, respectively, and $i\theta$ is the phase.

In some embodiments, module 110 includes a polarization beam splitter (PBS) 110a and two variable angle mirrors 110b and 110c. The angle between the two variable angle mirrors 110b and 110c defines the separation between the two optical rails 111a and 111b after the photons exit module 110. Changing the separation between the two optical rails 111a and 111b changes the coherence time of the quantum memory. Preferably, the separation between the two optical rails 111a and 111b may be changed such that the coherence time of the quantum memory is maximized without causing the two optical rails 111a and 111b to overlap spatially.

In some embodiments, after the pair of spatial qubits exit module 110, they enter device 112. Device 112 is configured to redirect the spatial qubit into the light-matter interface 113. In some embodiments, device 112 may be a polarization beam splitter (e.g., a Glan-Taylor polarizer). The light-matter interface 113 includes one or more atomic vapor cells 113a configured to store the quantum information carried by the pair of spatial qubits. For example, the one or more atomic vapor cells 113a may include a vapor of certain isotopes that can absorb and store the quantum information (e.g., atoms of $^{87}$Rb, atoms of Cs, or atoms of any other suitable alkali metal). The atomic vapor cells 113a may be enclosed in a temperature-controlled and magnetically-shielded container (e.g., formed of Mu-metal). It should be appreciated that though the illustration of FIG. 1 shows only a single atomic vapor cell 113a, the device 100 may include more than one (e.g., two, three, four, etc.) atomic vapor cells 113a, as aspects of this technology are not limited in this respect.

In some embodiments, after the qubit is stored in the atomic vapor cell 113a, the qubit may be retrieved from the atomic vapor cell 113a and directed to module 114 by polarization beam splitter 122. Module 114 is a mixed-angle Sagnac interferometer configured to map the spatial qubit into a polarization qubit (e.g., into a photon with the qubit encoded in an arbitrary polarization state). A final set of mirrors directs the polarization qubit to the output port 115, where device 100 outputs retrieved polarization qubits.

In some embodiments, device 100 includes a control field input 120. Control field input 120 is an input port for a control field laser beam. The control field laser beam is configured to control the process of storing and retrieving the qubits from device 100. Control qubits are directed from the control field input 120 to module 121. Module 121 is also a mixed-angle Sagnac interferometer like module 110. Module 121 is configured to split the received control field qubits into two identical, but spatially-separated, control field beams. Device 112 combines the two control field beams received from module 121 with the pair of spatial qubits (e.g., optical rails 111a and 111b) before the qubits enter the light-matter interface 113. When qubits are retrieved from the light-matter interface 113, polarization beam splitter 122 separates the control field beams from the retrieved qubits with a success rate of approximately 50 dB. The vast majority of the control beam is eliminated from the retrieved data qubits after polarization beam splitter 122.

Figure 2:
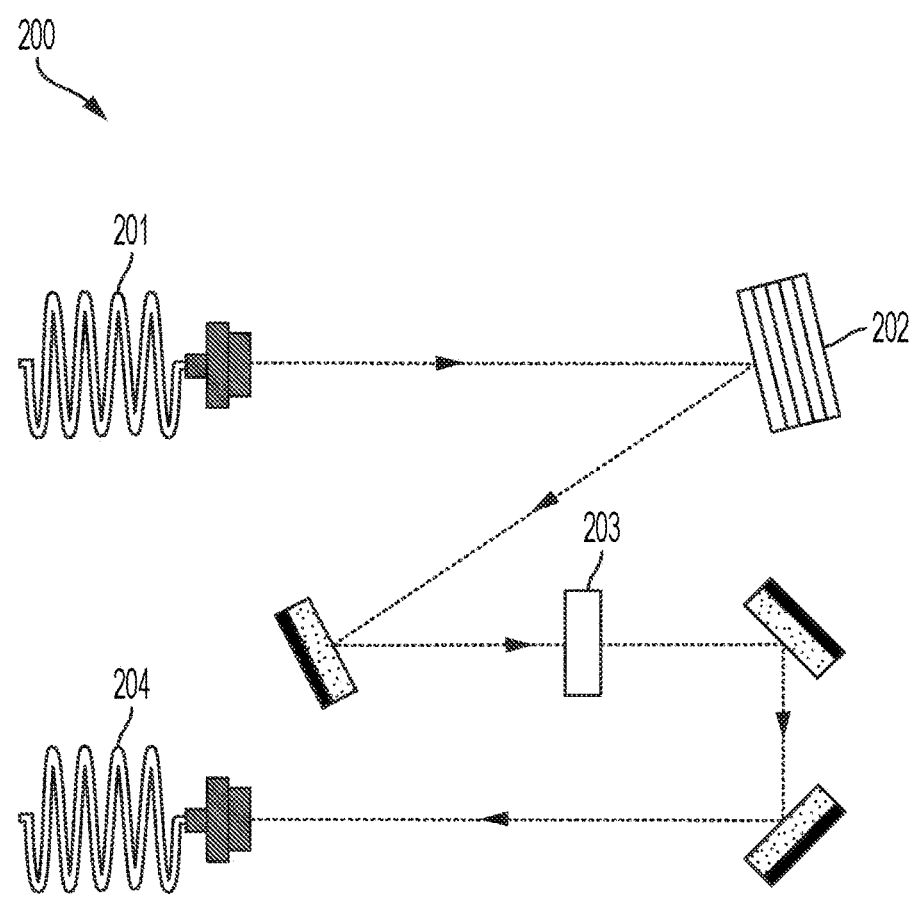
FIG. 2 is a schematic diagram of a device 200 configured to reduce noise present in the control laser beam before it enters the quantum memory, in accordance with some embodiments of the technology described herein.

FIG. 2 is a schematic diagram of a device 200 configured to reduce noise present in the control field laser beam before it enters the quantum memory, in accordance with some embodiments of the technology described herein. Device 200 is configured to reduce broadband noise in the control field laser beam. In particular, device 200 is configured to reduce broadband noise caused by the laser's amplified spontaneous emission (ASE) and Raman scattering that occurs as the control field laser beam propagates along optical fibers that enter the device 100.

In some embodiments, device 200 includes an input 201 and an output 204. The control field laser beam enters device 200 through the input 201 and exits the device 200 through the output 204. Output 204 of the device 200 may be coupled to the control field input 120 of device 100 such that device 200 provides the control field laser beam to the device 100. Output 204 may be optically coupled to the control field input 120 by, for example, a short optical fiber link or through a free space optical connection.

In some embodiments, device 200 includes a filter 202. The filter 202 may be a Bragg grating filter configured to reflect light within a narrow frequency band (e.g., approximately 20 GHz wide). In some embodiments, filter 202 may be passively adjusted to remain resonant with the control field laser beam's central frequency mode, thereby minimizing any laser or Raman emission outside of the control field laser's transmission peak from being transmitted out of device 200.

In some embodiments, device 200 includes a cavity 203 that is optically coupled to an output of filter 202. The cavity 203 may be a passive filtering cavity (e.g., a Fabry-Perot etalon cavity, a cavity having a frequency bandwidth of approximately 500 MHz). The cavity 203 may be stabilized, for example, using a PID-controlled temperature controller that encases the cavity 203. The cavity 203 is tuned to pass the central frequency mode of the control field laser.

Figure 3:
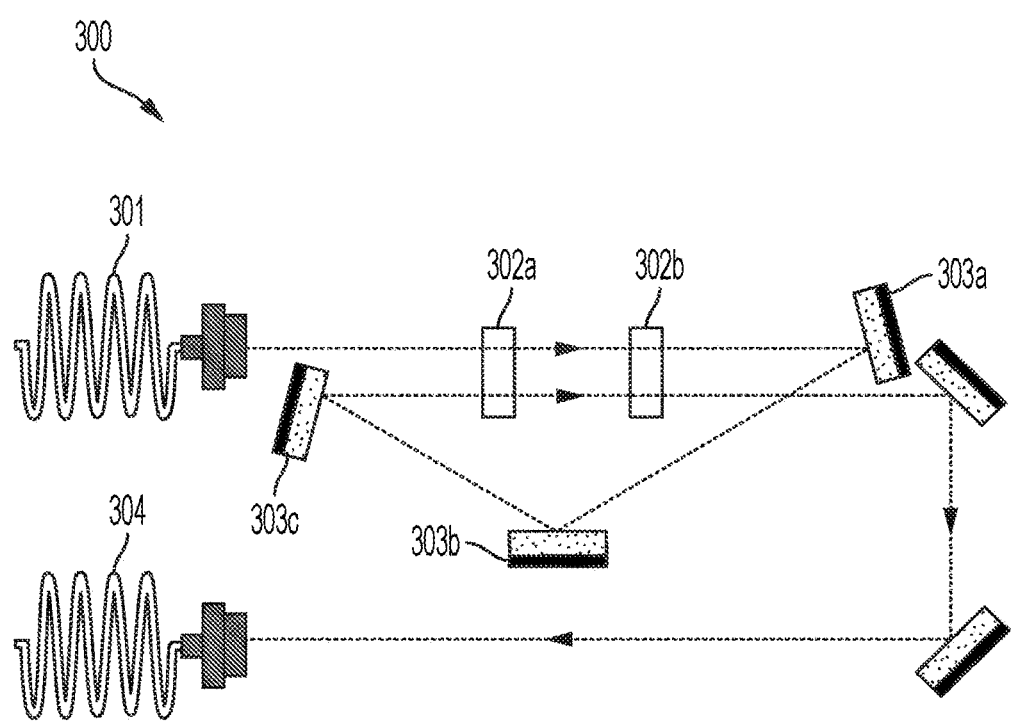
FIG. 3 shows a schematic diagram of a device 300 configured to filter the optical signal retrieved from device 100 of FIG. 1, in accordance with some embodiments of the technology described herein.

FIG. 3 shows a schematic diagram of a device 300 that is configured to filter the optical signal retrieved from device 100 as described in connection with FIG. 1 herein, in accordance with some embodiments of the technology described herein. The device 300 includes an input 301 and an output 304. The input 301 may be optically coupled (e.g., using an optical fiber or through free space) to the output 115 of device 100.

In some embodiments, the device 300 includes etalon cavities 302a and 302b. The etalon cavities 302a, 302b may be low finesse (e.g., having a finesse value of approximately 30) flat etalon cavities that offer high robustness against temperature fluctuations and are significantly less sensitive to the laser alignment compared to conventional curved etalons. In some embodiments, the light received by the etalon cavities 302a and 302b may be received with a slight incident angle. This incident angle eliminates the need for isolation between the two etalon cavities 302a and 302b. In some embodiments, this angle may be greater than 0° and less than 10°, 5°, 2°, and/or 1°.

In some embodiments, after the light passes through the etalon cavities 302a and 302b in a first instance, the light may be redirected back through the etalon cavities 302a and 302b for further filtering. For example, three mirrors 303a, 303b, and 303c may be used to redirect the light back through etalon cavities 302a and 302b for further filtering. By passing the light through the etalon cavities 302a and 302b twice, the light may be effectively filtered by four etalon cavities. The repeated filtering compensates for the low finesse of the cavities and provides an extinction value in a range from 100 dB to 150 dB on the remaining control field accompanying the qubits. Accordingly, when the qubits exit the device 300 at output 304, the qubits may have a signal to noise ratio (SNR) greater than or equal to 10 and less than or equal to 100.

Figure 4:
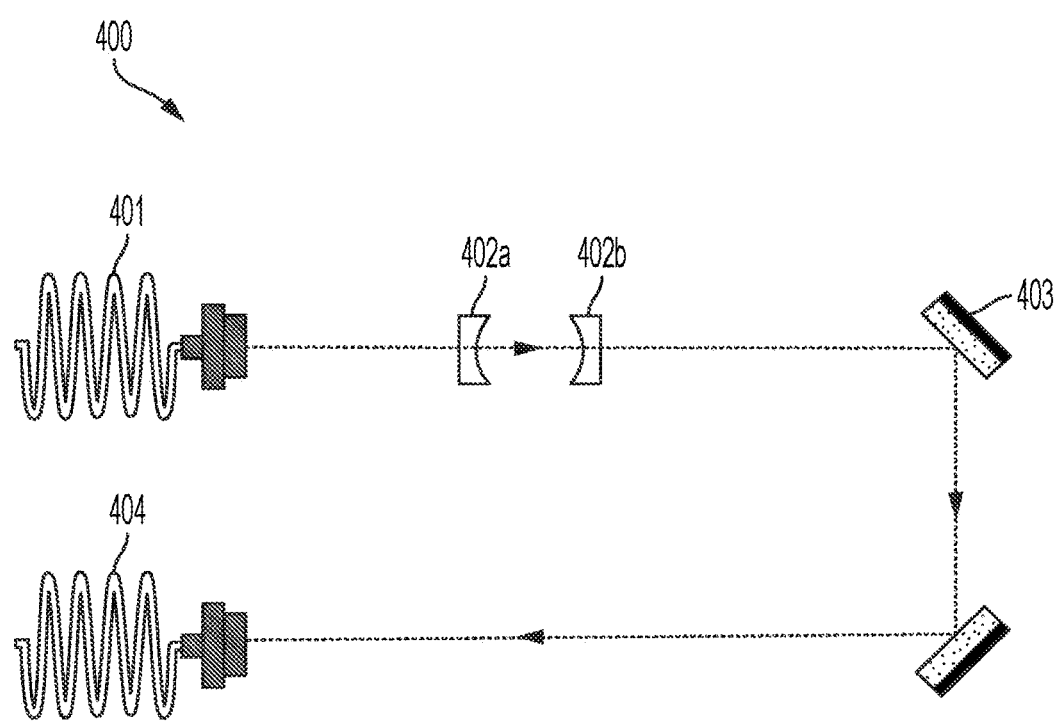
FIG. 4 shows a schematic diagram of another device 400 configured to filter the optical signal retrieved from device 100 of FIG. 1, in accordance with some embodiments of the technology described herein.

FIG. 4 shows a schematic diagram of a device 400 that is configured to filter the optical signal retrieved from device 100 as described in connection with FIG. 1 herein, in accordance with some embodiments of the technology described herein. The device 400 includes an input 401 and an output 404. The input 401 may be optically coupled (e.g., using an optical fiber or through free space) to the output 115 of device 100.

In some embodiments, the device 400 includes etalon cavities 402a and 402b. The etalon cavities 402a, 402b may be curved etalon cavities. In some embodiments, the light received by the etalon cavities 402a and 402b may be received with a slight incident angle. This incident angle eliminates the need for isolation between the two etalon cavities 402a and 402b. In some embodiments, this angle may be greater than 0° and less than 10°, 5°, 2°, and/or 1°. The etalon cavities 402a, 402b may provide an extinction value in a range from 100 dB to 150 dB on the remaining control field accompanying the qubits. Accordingly, when the qubits exit the device 400 at output 404, the qubits may have a signal to noise ratio (SNR) greater than or equal to 10 and less than or equal to 100, as described in connection with FIG. 9 herein.

Figure 5:
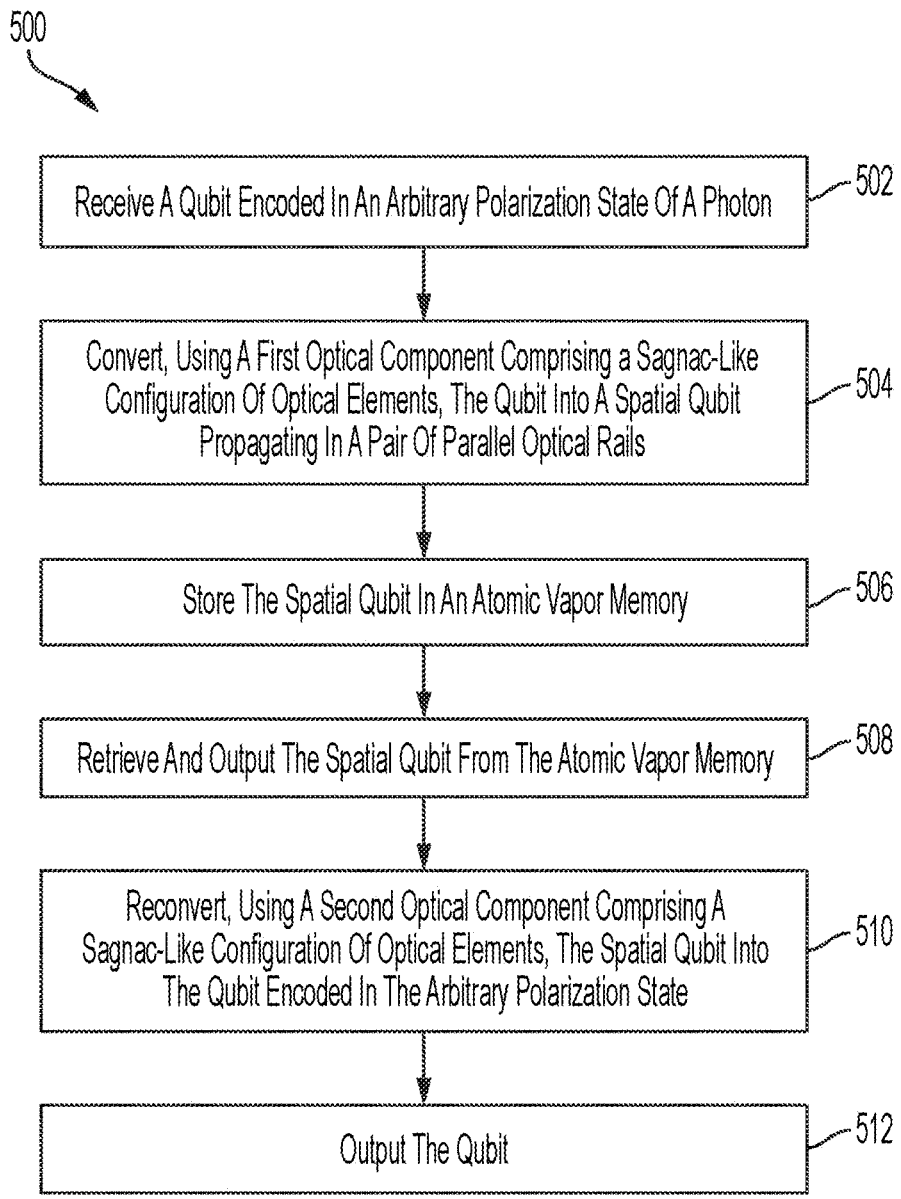
FIG. 5 is a flowchart describing a process 500 for storing and retrieving a qubit, in accordance with some embodiments of the technology described herein.

FIG. 5 is a flowchart describing a process 500 for storing and retrieving a qubit, in accordance with some embodiments of the technology described herein. Process 500 may be performed, for example, using optical device 100 as described in connection with FIG. 1 herein, in some embodiments.

Process 500 may begin at act 502, in which a qubit encoded in an arbitrary polarization state of a photon is received. For example, the arbitrary polarization state |p⟩ of the photon may be described by:

$$|\psi\rangle = a|H\rangle + be^{i\theta}|V\rangle,$$

where |H⟩ and |V⟩ are the horizontal and vertical polarization basis states and iθ is the phase of the photon.

In some embodiments, the qubit may be received by the optical device over an optical fiber connection. For example, the qubit may be received over telecommunications optical fiber from a qubit source located a distance (e.g., kilometers) away from the optical device. Alternatively, in some embodiments the qubit may be received over optical fiber or through free space from a qubit source co-located with the optical device (e.g., in a same room as the optical device, in a same facility as the optical device).

After act 502, process 500 may proceed to act 504 in some embodiments. At act 504, the received qubit may be converted into a spatial qubit propagating in a pair of parallel optical rails. The received qubit may be converted using a first optical component comprising a Sagnac-like configuration of optical elements. For example, the first optical component may be module 110 of optical device 100 as described in connection with FIG. 1 herein.

In some embodiments, converting the qubit into a spatial qubit may include receiving the qubit at a polarization beam splitter (PBS; e.g., PBS 110a) and converting the qubit into the spatial qubit using the PBS. For example, the PBS may encode the arbitrary polarization state of the received qubit into a spatial qubit output encoded in the spatial state of $a|L\rangle + be^{i\theta}|R\rangle$, where |L⟩ and |R⟩ are the left and right rails, respectively.

In some embodiments, directing the spatial qubit back through the PBS using first and second variable angle mirrors (e.g., variable angle mirrors 110b, 110c) may physically separate the two beams into a pair of parallel optical rails. The degree of physical separation of the optical rails (e.g., a spacing between the optical rails) may be adjusted by changing a relative angle of the first and/or second variable angle mirrors with respect to the PBS. After the parallel optical rails are separated, the spatial qubit may be output from the PBS and from the first optical component.

After act 504, process 500 may proceed to act 506, in some embodiments. At act 506, the spatial qubit may be stored in an atomic vapor memory. For example, the spatial qubit may be stored using light-matter interface 113 as described in connection with FIG. 1 herein. The atomic vapor memory may include one or more atomic vapor cells. The one or more atomic vapor cells 113a may include a vapor of certain isotopes that can absorb and store the quantum information (e.g., atoms of $^{87}$Rb, atoms of Cs, or atoms of any other suitable alkali metal). The atomic vapor cells 113a may be enclosed in a temperature-controlled and magnetically-shielded container (e.g., formed of Mu-metal). In some embodiments, the parallel optical rails may be combined with a pair of control field beams before the spatial qubit is stored in the atomic vapor memory.

In some embodiments, a coherence time for storage of the qubit may be tuned. For example, the coherence time may be tuned by increasing the spacing between rails of the pair of parallel optical rails (e.g., by changing an angle of the first and/or second variable angle mirrors with respect to the PBS of the first optical component). Alternatively or additionally, the coherence time may be tuned by changing a diameter of each rail of the pair of parallel optical rails incident to the atomic vapor memory.

After act 506, process 500 may proceed to act 508, in some embodiments. At act 508, the spatial qubit may be retrieved and output from the atomic vapor memory.

After act 508, process 500 may proceed to act 510, in some embodiments. At act 510, the spatial qubit may be reconverted into a qubit encoded in an arbitrary polarization state of a photon. The spatial qubit may be reconverted using a second optical component comprising a Sagnac-like configuration of optical elements. For example, the second optical component may be module 114 of optical device 100 as described in connection with FIG. 1 herein.

In some embodiments, reconverting the spatial qubit into the qubit may include receiving the spatial qubit at a polarization beam splitter (PBS) and converting the spatial qubit into the qubit using the PBS. Another pair of variable angle mirrors may be used to rejoin the pair of parallel optical rails into a single beam for output.

After act 510, process 500 may proceed to act 512, in some embodiments. At act 512, the qubit may be output. For example, the qubit may be output into a fiber optic cable using a fiber optic connection. Alternatively, the qubit may be output into free space using a free space optical connection.

In some embodiments, after the qubit is output, the qubit may be further filtered. For example, the qubit may be passed through one or more etalon cavities. In some embodiments, the qubit may be passed through two curved etalons. The two curved etalons may be arranged with their incident faces at a small off-parallel angle.

Alternatively, in some embodiments, the qubit may be passed in a first instance and again in a second instance along a first direction through two flat etalons. In the first instance, the qubit may pass through the two flat etalons at a first location to one side of a central axis of the two flat etalons. In the second instance, the qubit may pass through the two flat etalons at a second location to another side of the central axis. Passing the qubit through the two flat etalons in the first and second instances may achieve an extinction ratio of greater than or equal to 100 dB and less than or equal to 150 dB. In some embodiments, three or more mirrors may be used to steer the qubit through the two flat etalons in the second instance. The two flat etalons may be arranged with their incident faces at a small off-parallel angle.

Figure 6A:
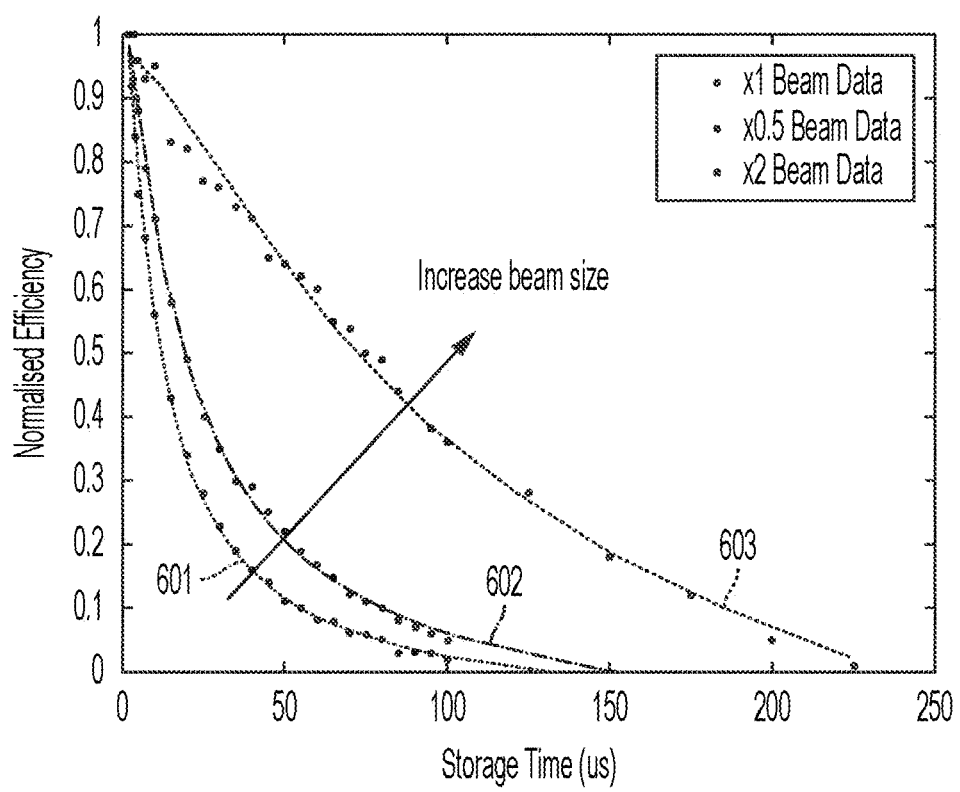
FIG. 6A is a plot showing the effect of beam diameter on the coherence time of qubit storage of the atomic vapor memory of the light-matter interface, in accordance with some embodiments of the technology described herein.

FIG. 6A is a plot showing the effect of beam diameter on the coherence time of qubit storage of the atomic vapor memory of the light-matter interface, in accordance with some embodiments of the technology described herein. The plot shows normalized efficiency on the vertical axis and storage time in microseconds on the horizontal axis. Three curves 601, 602, and 603 are plotted. Each curve 601, 602, and 603 represents an exponential fit to measurements of the storage efficiency of a quantum memory (e.g., like optical device 100 of FIG. 1 herein) at different storage times for different beam diameters used in the parallel optical rails of the quantum memory. Curve 601 shows a fit to data acquired using a beam at half of a normalized diameter. Curve 602 shows a fit to data acquired using a beam at a normalized diameter. Curve 603 shows a fit to data acquired using a beam at twice a normalized diameter. The data indicates that as the beam size increases from curve 601 to curve 603, both the coherence time is increased. This data shows that the coherence time of a quantum memory as described herein may be tuned based on the beam size of the parallel optical rails of the quantum memory.

Figure 6B:
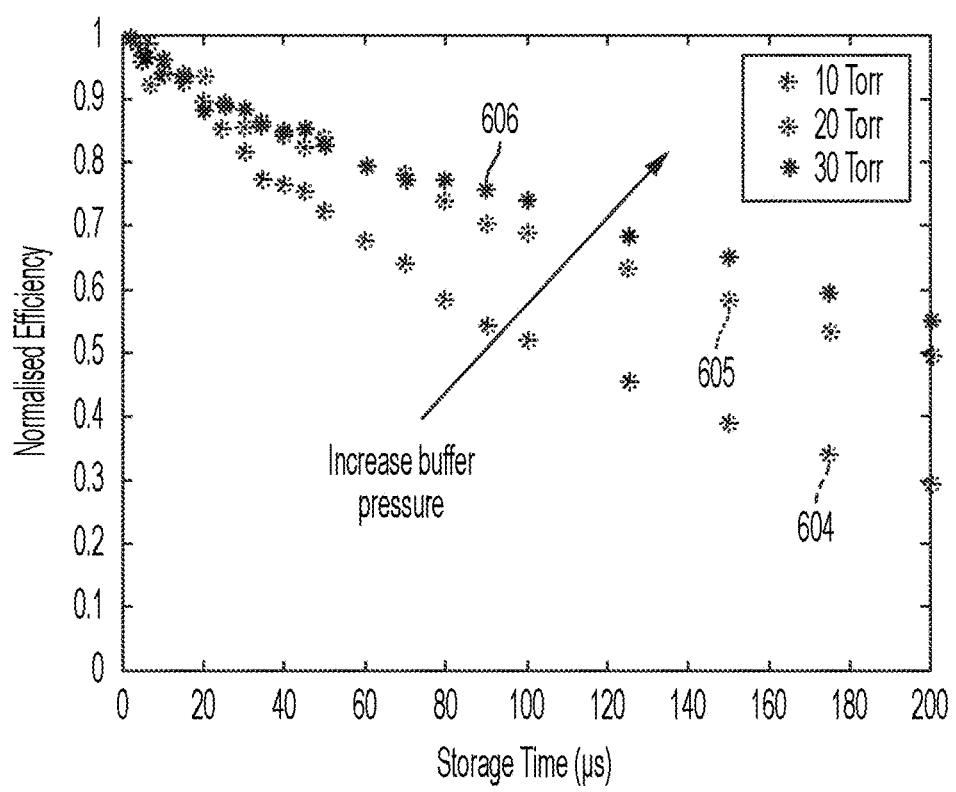
FIG. 6B is a plot showing the effect of atomic vapor cell vapor pressure on the coherence time of the atomic vapor memory of the light-matter interface, in accordance with some embodiments of the technology described herein.

FIG. 6B is a plot showing the effect of atomic vapor cell vapor pressure on the coherence time of the atomic vapor memory of the light-matter interface, in accordance with some embodiments of the technology described herein. The plot shows normalized efficiency on the vertical axis and storage time in microseconds on the horizontal axis. Three data sets 604, 605, and 606 are plotted. Each data set 604, 605, and 606 was acquired for different values of vapor pressure in the atomic vapor cells of the light-matter interface of the quantum memory. Data sets 604, 605, and 606 were acquired with a vapor pressure of 10 Torr, 20 Torr, and 30 Torr, respectively. The data indicates that as the vapor pressure increases from data set 604 to 605, the coherence time is increased. This data shows that the coherence time of a quantum memory as described herein may be tuned based on the vapor pressure of the atomic vapor cells used in the quantum memory. Combining the effects of beam size and vapor pressure, coherence times in a range from 0.5 ms to 10 ms can be achieved.

Figure 7A:
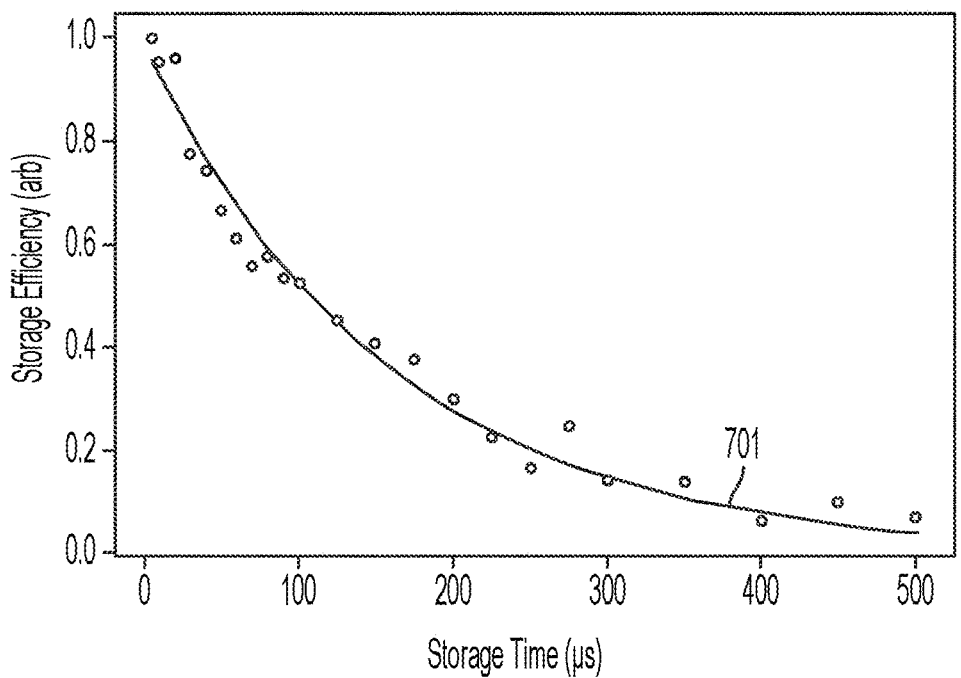
FIGS. 7A and 7B are plots showing the storage efficiency as a function of storage time for the left and right optical rails, in accordance with some embodiments of the technology described herein.
Figure 7B:
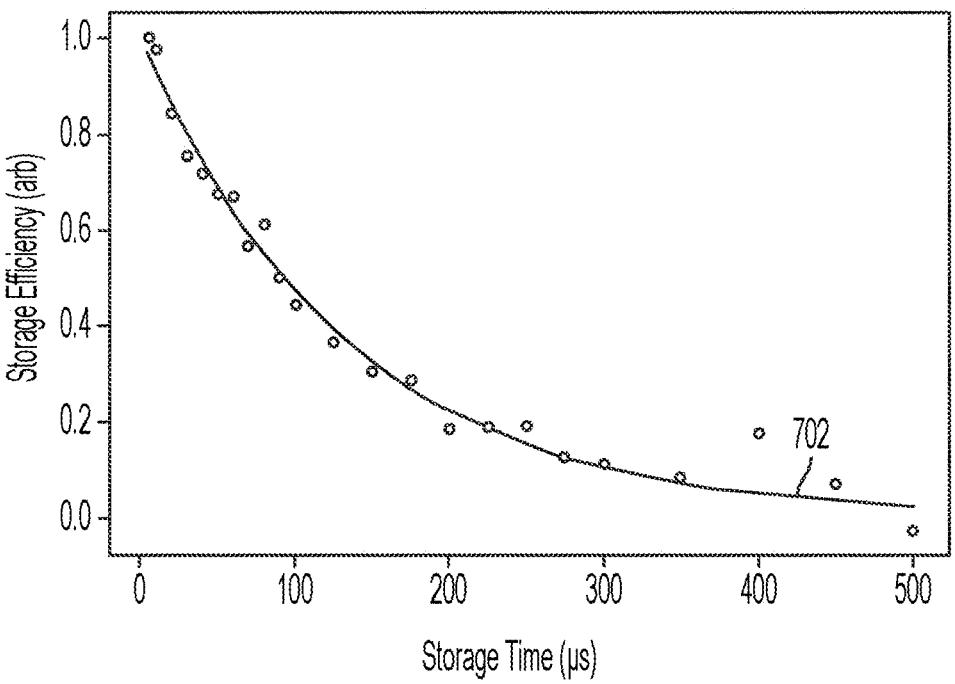

FIGS. 7A and 7B are plots showing the storage efficiency as a function of storage time for the left and right optical rails, respectively, of a quantum memory in accordance with some embodiments of the technology described herein. The plots show storage efficiency on the vertical axis and storage time in microseconds on the horizontal axis. Curve 701 is an exponential fit to data acquired from the left optical rail and curve 702 is an exponential fit to data acquired from the right optical rail. The coherence time may be extracted from the fits of curves 701 and 702 and is 157±8 μs for the left rail and 133±6 μs for the right rail.

Figure 8:
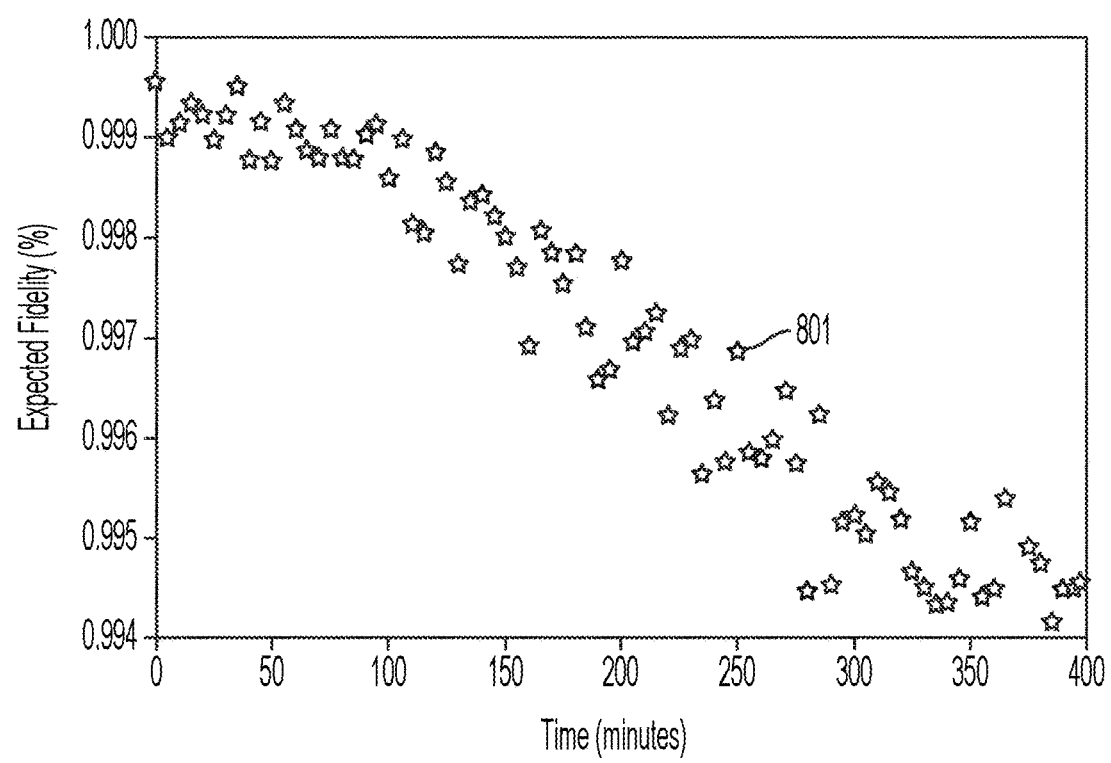
FIG. 8 is a plot showing the classical fidelity over time of the atomic vapor memory of the light-matter interface, in accordance with some embodiments of the technology described herein.

FIG. 8 is a plot showing the classical fidelity over time of the atomic vapor memory of the light-matter interface, in accordance with some embodiments of the technology described herein. The plot shows classical fidelity on the vertical axis and time in minutes on the horizontal axis. Data points 801 were collected by measuring the fidelity of qubits stored in a quantum memory as described herein at different retrieval times. Measured fidelities are greater than 99.4% up to 400 minutes after storage of the qubits.

Figure 9:
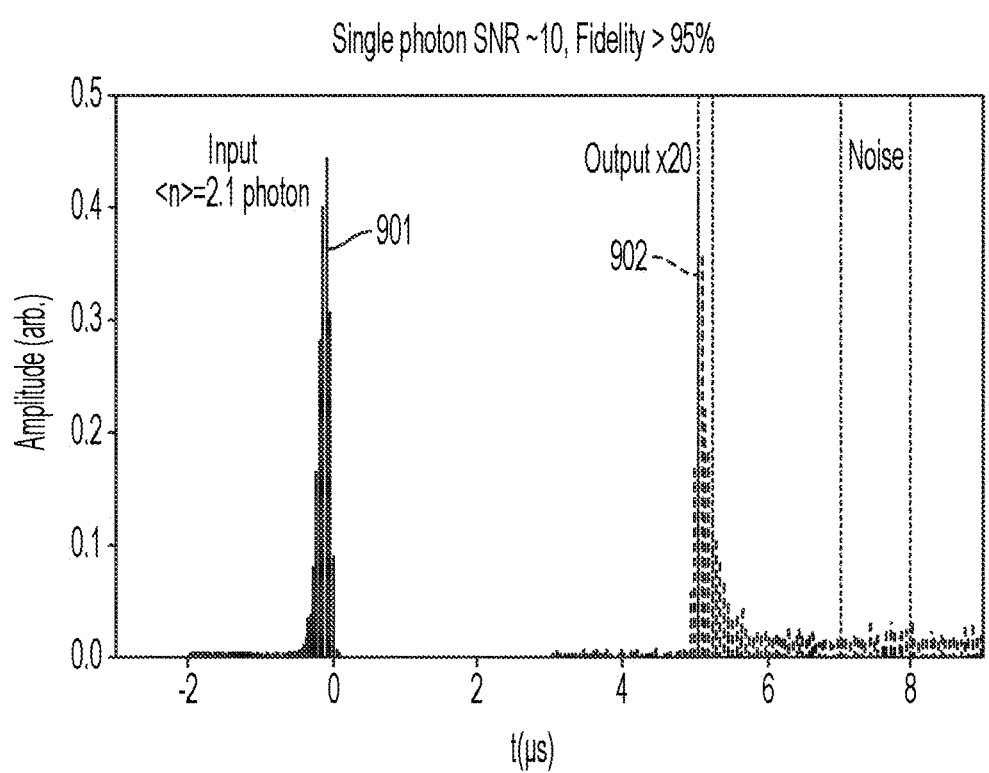
FIG. 9 is a plot showing the signal-to-noise ratio (SNR) of retrieved photons from the atomic vapor memory of the light-matter interface, in accordance with some embodiments of the technology described herein.

FIG. 9 is a plot showing the signal-to-noise ratio (SNR) of retrieved photons from the atomic vapor memory of the light-matter interface, in accordance with some embodiments of the technology described herein. The plot shows the measured photon amplitude on the vertical axis and time in microseconds on the horizontal axis. The left peak 901 is due to an input qubit to the quantum memory, and the right peak 902 is due to the retrieval of the qubit from the quantum memory after 5 μs of storage. The measured SNR is approximately 10 for a dual rail quantum memory or 20 for a single rail quantum memory (e.g., if polarization does not need to be stored). Such a high SNR results in a fidelity greater than 95%.

Various aspects of the embodiments described above may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

The word "exemplary" is used herein to mean serving as an example, instance, or illustration. Any embodiment, implementation, process, feature, etc. described herein as exemplary should therefore be understood to be an illustrative example and should not be understood to be a preferred or advantageous example unless otherwise indicated.

Having thus described several aspects of at least one embodiment, it is to be appreciated that various alterations, modifications, and improvements will readily occur to those skilled in the art. Such alterations, modifications, and improvements are intended to be part of this disclosure and are intended to be within the spirit and scope of the principles described herein. Accordingly, the foregoing description and drawings are by way of example only.

What is claimed is:

1. A quantum memory device, comprising:
   a first optical component configured to convert an input qubit encoded in an arbitrary polarization state of a photon into a spatial qubit propagating in a pair of parallel optical rails;
   an atomic vapor memory coupled to an output of the first optical component and configured to store the spatial qubit in an atomic vapor; and
   a second optical component coupled to an output of the atomic vapor memory, the second optical component configured to convert the spatial qubit, when retrieved from the atomic vapor memory, into an output qubit, the output qubit encoded in the arbitrary polarization state of a photon.

2. The quantum memory device of claim 1, wherein the first optical component and/or the second optical component are a Sagnac-like device that comprises:
   a polarization beam splitter (PBS);
   a first variable angle mirror optically coupled to a first output of the PBS; and
   a second variable angle mirror optically coupled to a second output of the PBS.

3. The quantum memory device of claim 2, wherein:
   the first variable angle mirror is disposed at a first angle relative to the polarization beam splitter, and
   the second variable angle mirror is disposed at a second angle relative to the polarization beam splitter, wherein the second angle is different than the first angle.

4. The quantum memory device of claim 3, wherein changing the first and/or second angle causes a change in a separation between optical rails of the pair of parallel optical rails.

5. The quantum memory device of claim 1, further comprising a Bragg grating filter optically coupled to an input of the first optical component.

6. The quantum memory device of claim 1, further comprising a pair of flat etalon cavities optically coupled to an output of the second optical component.

7. The quantum memory device of claim 6, wherein the flat etalon cavities of the pair of flat etalon cavities are arranged with their incident faces at a small off-parallel angle.

8. The quantum memory device of claim 6, further comprising at least three mirrors configured to cause the output qubit to pass through the pair of flat etalon cavities at least twice.

9. The quantum memory device of claim 1, further comprising a pair of curved etalon cavities optically coupled to an output of the second optical component.

10. A method of storing and retrieving a qubit, the method comprising:
    receiving a qubit encoded in an arbitrary polarization state of a photon;
    converting, using a first optical component comprising a Sagnac-like configuration of optical elements, the qubit into a spatial qubit propagating in a pair of parallel optical rails;
    storing the spatial qubit in an atomic vapor memory;
    retrieving and outputting the spatial qubit from the atomic vapor memory;
    reconverting, using a second optical component comprising a Sagnac-like configuration of optical elements, the spatial qubit into the qubit encoded in the arbitrary polarization state; and
    outputting the qubit.

11. The method of claim 10, wherein converting the qubit into a spatial qubit comprises:
    receiving the qubit at a polarization beam splitter (PBS);
    converting the qubit into the spatial qubit using the PBS;
    directing the spatial qubit back through the PBS using a first variable angle mirror and a second variable angle mirror; and
    outputting, from the PBS, the spatial qubit to a pair of parallel optical rails.

12. The method of claim 11, wherein:
    the first variable angle mirror is disposed at a first angle relative to the PBS,
    the second variable angle mirror is disposed at a second angle relative to the PBS, and
    the method further comprises changing a spacing between rails of the pair of parallel optical rails by changing the first and/or the second angle.

13. The method of claim 12, further comprising changing a coherence time for storage of the qubit by:
    increasing the spacing between rails of the pair of parallel optical rails; and
    increasing a diameter of each rail of the pair of parallel optical rails incident to the atomic vapor memory.

14. The method of claim 10, further comprising combining a pair of control field beams with respective rails of the pair of optical rails prior to storing the spatial qubit in the atomic vapor memory.

15. The method of claim 14, further comprising filtering an input control field beam using a Bragg grating filter.

16. The method of claim 10, further comprising, after outputting the qubit:
    passing the qubit in a first instance and in a first direction through two flat etalons, the two flat etalons being arranged with their incident faces at a small off-parallel angle; and
    passing the qubit in a second instance and in the first direction through the two flat etalons.

17. The method of claim 16, wherein passing the qubit in the second instance through the two flat etalons comprises using three or more mirrors to steer the qubit.

18. The method of claim 16, wherein:
    the qubit, in the first instance, passes through the two flat etalons at a first location to one side of a central axis of the two flat etalons; and
    the qubit, in the second instance, passes through the two flat etalons at a second location to another side of the central axis.

19. The method of claim 16, wherein passing the qubit through the two flat etalons in the first and second instances achieves an extinction ratio of greater than or equal to 100 dB and less than or equal to 150 dB.

20. The method of claim 10, further comprising, after outputting the qubit:
    passing the qubit in a first direction through two curved etalons, the two curved etalons being arranged with their incident faces at a small off-parallel angle.

* * * * *